Oct. 18, 1966 R. EMEIS 3,280,387

ENCAPSULED SEMICONDUCTOR WITH ALLOY-BONDED CARRIER PLATES AND PRESSURE MAINTAINED CONNECTORS

Filed Nov. 21, 1962

United States Patent Office 3,280,387

Patented Oct. 18, 1966

3,280,387

ENCAPSULED SEMICONDUCTOR WITH ALLOY-BONDED CARRIER PLATES AND PRESSURE MAINTAINED CONNECTORS

Reimer Emeis, Ebermannstadt, Germany, assignor to Siemens-Schuckertwerke Aktiengesellschaft, Erlangen, Germany, a German corporation Filed Nov. 21, 1962, Ser. No. 239,201
Claims priority, application Germany, Nov. 28, 1961, S 76,864
12 Claims. (Cl. 317—234)

My invention relates to encapsuled electronic semiconductor devices such as rectifier diodes, power rectifiers, transistors and other devices of the area-junction type.

In a more particular aspect my invention relates to semiconductor devices in which a monocrystalline semiconductor plate, for example of silicon or germanium, is alloy-bonded in face to face relation to a carrier plate of metal having a thermal coefficient of expansion departing only slightly from that of the semiconductor material, as is the case with molybdenum, tungsten or chromium relative to silicon and germanium. However, manufacturing and operational trouble may result from the use of a solder bond between the carrier plate of metal and an adjacent heat-sink structure or contact body of copper or similarly good conducting material. According to my copending application Serial No. 209,047, filed July 11, 1962 and assigned to the assignee of the present invention, such trouble can be eliminated by placing the semiconductor member, comprising the appertaining alloy-bonded electrode means and the likewise alloy-bonded carrier plate, between the heat-sink structure and another conducting structure and applying between them an area pressure by means of springs so that the supply of current to the semiconductor plate is effected by mechanical contact engagement free from solder or any other fusion bond and thus permits slight relative displacements between the carrier plate and the adjacent heat-sink or contact structure as may be due to respectively different coefficients of thermal expansion when the semiconductor device is being heated during operation.

It is an object of my invention to improve encapsuled semiconductor devices of the kind just mentioned toward improved uniformity in design and assembly, particularly in such a manner that one and the same components can be readily assembled selectively to produce encapsuled semiconductor devices of one or the opposite direction of forwarded conductance as may be desired for particular purposes.

According to my invention, I provided the essentially monocrystalline semiconductor plate in an encapsuled device generally designed as described in the foregoing, with two carrier plates of metal having a thermal coefficient of expansion similar to that of the semiconductor material, these two metal plates being alloyed with, and into, the semiconductor material on the two flat sides respectively of the semiconductor plate, and I further give the two metal plates the same or nearly the same dimensions with respect to their areas of bonding engagement.

According to another, more specific feature of my invention the two metal plates and the semiconductor plate have a circular shape and coaxial arrangement, and the two metal plates have a larger diameter than the intermediate semiconductor plate so that the two metal plates radially protrude equally beyond the periphery of the semiconductor plate and thereby form a groove around the periphery of the semiconductor plate. I further fill this groove with insulating material such as casting resin or other synthetic plastic.

The foregoing and other objects, advantages and features of my invention will be apparent from the embodiment illustrated by way of example in the accompanying drawing, in which.

Figure 2:
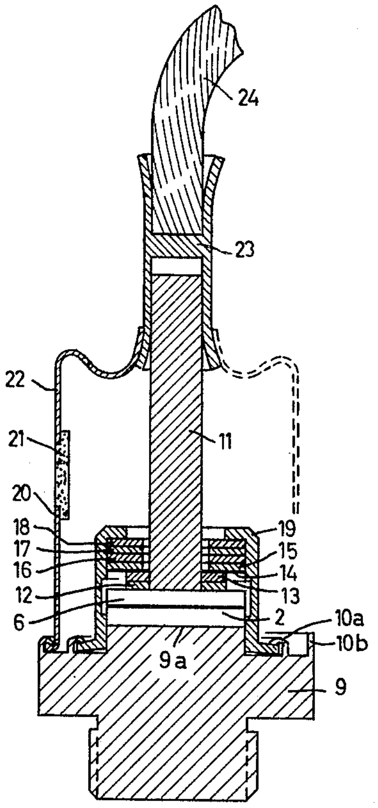
FIG. 2 is an axial section of a complete encapsulated semiconductor device according to the invention of which the semiconductor member of FIG. 1 constitutes a component.

The semiconductor member to be used as a component of the encapsuled device according to the invention, has a semiconductor disc or plate provided on both flat sides with carrier or compensating plates consisting of metal whose thermal coefficient of expansion is similar to that of the semiconductor material. That is, the thermal coefficient of expansion of the metal should be no more than twice that of the semiconductor material. Suitable as such metals are molybdenum, tungsten and chromium in conjunction with crystalline semiconductor bodies of germanium or silicon. The carrier plates are preferably joined with the semiconductor disc by alloying. A suitable alloying method is known, for example, from the German published patent application DAS 1,018,557. According to that method, alloy electrodes, for example of gold or aluminum, are placed upon the respective flat sides of the semiconductor disc, each of the electrodes consisting of foil material which is heated under pressure together with the semiconductor substance to form an alloy therewith. Thereafter the compensating or carrier disc is fused to the alloy-bonded electrode. The compensating or carrier plate, for example of molybdenum, should be at least as large as the area of the alloy bond formed by the electrode and the semiconductor material. The semiconductor members made by such methods and comprising the semiconductor disc with its electrode means and the carrier plates are electrically asymmetrical but are to a large extent symmetrical with respect to mechanical design.

Such a mechanically symmetrical and electrically asymmetrical semiconductor member can also be produced in the manner described in my copending application Serial No. 208,988, filed July 11, 1962 and assigned to the assignee of the present invention. The embodiment of the semiconductor member illustrated in FIG. 1 of the accompanying drawing is produced accordingly, namely as follows.

Placed upon a circular molybdenum plate 2 of about 22 mm. diameter is an aluminum disc of about 19 mm. diameter. Coaxially placed upon the aluminum disc 3 is a monocrystalline circular disc 4 of p-type silicon having a specific resistance of about 1000 ohm cm., the diameter of the disc being about 18 mm. Thereafter a gold foil, containing about 0.5% antimony, the remainder being gold, is placed on top. The foil has a somewhat smaller diameter, for example 14 mm., than the silicon disc. The entire assembly is then embedded in graphite powder. The embedded assembly, kept under pressure, is heated at about 800° C. in an alloying furnace evacuated or filled with protective gas. The result is a component which, according to FIG. 1, comprises the carrier plate 2 of molybdenum, the semiconductor disc 4 bonded with the carrier plate by an aluminum alloy, and the electrode 5 alloyed into the opposite surface of the semiconductor disc.

A carrier plate 6 is separately prepared by coating it with silver. This can be done, for example, by placing upon the plate 6 a silver foil 7 of about 0.1 mm. thickness and joining the foil with the plate by rolling or soldering. The carrier plate 6 may also consist of molybdenum and has the same diameter and preferably also the same thickness as the molybdenum plate 2. After preparing the plate 6 in the manner described, its silver-coated side is placed into face-to-face engagement with the flat side of the semiconductor disc 4 that carries the electrode 5 consisting of gold-semiconductor eutectic.

Thereafter the silver-coated plate 6 is pressed against the gilded side of the semiconductor disc. Suitable for this purpose is a pressure of about 300 kg./cm.$^2$, for example. The compressed assembly is then kept for several hours at an elevated temperature below the melting point of the gold-semiconductor eutectic. Suitable is a temperature of 250° C. applied for about 5 hours.

It is preferable to subject the mutually contacting surfaces of the silver coating and the electrode 5 to a lapping operation to make them accurately planar prior to assembling the silver-coated plate 6 with the semiconductor disc, thus securing a maximal large-area engagement. After completion of the above-mentioned heating treatment, the silver coating and the gold-semiconductor eutectic are firmly joined with each other, due to diffusion or sintering. Pressure, temperature and processing time of the heat treatment can be varied within relatively wide limits. This is because a diffusion of silver into the gold-semiconductor eutectic or of gold into the silver requires less time at higher temperatures and more time at lower temperatures, but in both cases can be effected to a sufficiently great extent. It has been found that a temperature between about 200 and 300° C. is technologically applicable. At lower temperatures the necessary processing time becomes excessive or the results are unsatisfactory within economical time limits; and at higher temperatures there is danger that the gold-semiconductor eutectic may commence to melt locally, due to lowering of the melting point at the pressure applied. (The melting point of the gold-silicon eutectic is at about 370° C.; gold-germanium eutectic melts at about 360° C.)

The subassembly consisting of parts 2 to 5 can be subjected to any desired surface treatment before adding the parts 6 and 7. For example, the surface of the exposed semiconductor material can be etched and coated with insulating varnish before contacting the electrode 5 with the silver coated plate 6.

Figure 1:
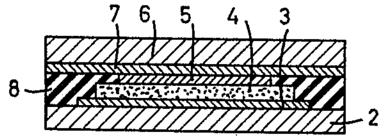
FIG. 1 shows in diametrical section a semiconductor member.

The above-described semiconductor member according to FIG. 1 has asymmetrical electrical conductance. That is, the semiconductor member constitutes a rectifier diode which will conduct essentially in a given forward direction only. Nevertheless, the semiconductor member is symmetrical with respect to mechanical design to such an extent that the forward direction of the encapsulated semiconductor device according to FIG. 2, of which the member forms a component, depends only on the selected orientation with which the member is placed into relation to the other components.

The device shown in FIG. 2 comprises a heat-sink body constituted by a massive copper block 9 which has an integral threaded stud for mounting it on a support and has also a central projection 9*a* with a flat top surface on which the semiconductor member according to FIG. 1 is located. In the embodiment illustrated in FIG. 2, the carrier plate 2 of the semiconductor member is in face-to-face engagement with the planar top surface of the projection 9*a*. An annular coaxial projection 10*a* of the copper block 9 serves for fastening a cup-shaped holder 19 to the block 9. Another annular projection 10*b* along the peripheral edge of the circular block 9 serves for fastening a cup-shaped housing portion 20 to the block.

When assembling the device it is preferable to place a thick silver layer, for example a foil of 100 to 200 microns thickness, between the projection 9*a* and the carrier plate 2 of the semiconductor member. With a minimum thickness of such an interposed silver layer of more than 50 microns, a penetration of copper through the silver layer to the molybdenum or other material of the disc, as may interfere with the desired lateral mobility of the semiconductor member, is reliably prevented.

Tests have shown that it is not necessary to fasten the silver layer to the copper block by soldering or other fusion methods. It suffices to simply place the silver foil between the projection 9*a* of the copper block and the carrier plate 2. The passage of electric current and heat are so slightly impeded by such a silver layer that the effect remains negligible. According to a preferred mode of proceeding, the silver foil, before being placed between the copper block and the carrier plate, is annealed and thereafter etched, for example by nitric acid. This produces a fine etching pattern on the foil surface. It is further of advantage to lap the top side of the projection 9*a* as well as the bottom side of the carrier plate 2 to accurate planar shape, in order to reliably secure a good transfer of heat and current between these components and the silver foil. The lapping operation is preferably so carried out that the resulting surfaces have a roughness depth between 0.5 and 50 microns, preferably between 1 and 3 microns. Such a method is more fully described in my copending application Serial No. 220,336, filed August 29, 1962, and assigned to the assignee of the present invention. After such accurate lapping each of the two contact surfaces is planar to such a great extent that the departures of the median surface plane from an accurate geometric plane are not larger than the roughness depth. One of the two surfaces of the projection 9*a* and the adjacent carrier plate of the semiconductor member may also be polished. In this case, however, care should be taken that the arcuate shape of the surface ordinarily resulting from polishing does not cause an excessive departure of the median plane from the accurate geometrical plane. That is, at least one of the two surfaces should possess the preferred roughness depth mentioned above.

After placing the semiconductor member upon the top surface of the projection 9*a*, a plunger-like part is placed upon the carrier plate on top of the semiconductor member. The plunger-shaped part is preferably assembled before mounting the individual components together. The plunger subassembly comprises a cylindrical pin 11 of copper, a ring disc 12 likewise consisting of copper. The disc 12 is joined with the pin 11 for example by a pressure connection, hard-soldering or other suitable means. Another silver foil is interposed between the plunger assembly and the carrier plate 6, the design and preferred method steps relating to the contact engagement between plunger pin 11 and carrier plate 6 being fully in accordance with those described above with reference to the contact engagement between the copper block 9 and the carrier plate 2.

The assembling work is continued by placing upon the plunger pin 11 the following components in the sequence here given: A washer 13 of steel, a ring-shaped disc 14 of mica, another washer 15 of steel and three annular spring discs 16, 17 and 18, which normally have somewhat arcuate cross-sectional shape and can be axially compressed to planar shape for the purpose of then exerting spring pressure in the axial direction. Subsequently a holder structure 19 in form of a bell or cup is placed over the plunger assembly. With the aid of the holder 19 the springs 16, 17, 18 are axially pressed together, and the holder cup is then fastened at its flange-like rim to the copper block 9 by bending the ridge 10*a* inwardly as shown. The springs 16, 17, 18 apply a contact pressure of 100 to 500 kg./cm.$^2$ between the semiconductor member comprising the semiconductor disc 4 and the carrier plates 2 and 6 and the copper block 9.

As is apparent from FIG. 2, the resulting device is extremely compact and has all of its individual parts accurately held fast in the correct position so that they cannot become displaced either by mechanical shock or by thermal stresses. The annular mica disc 14 electrically insulates the cup-shaped holder 19 from the top surface of the semiconductor member and also centers the plunger assembly in the holder 19 relative to the semiconductor member. The outer edge of the mica disc 14 abuts against the inner wall of the holder 19, whereas the inner edge of the mica disc touches the copper pin 11, thus securing it in accurately centered position.

The cup-shaped holder 19 has an undercut recess peripherally along its inner side. By virtue of this annular recess the upper portion of the semiconductor member, including the carrier plate 6, remains spaced from the holder 19. The lower carrier plate 2, however, abuts peripherally against the holder cup 19 and thus keeps the semiconductor member centered with respect to the axis of the holder 19.

The device is completed by placing a bell-shaped top portion of the housing over the entire arrangement of parts. The upper housing portion is composed of individual parts 20, 21, 22 and 23. The lower part 20 has a flange fastened to the copper block 9 by bending the rim portion 10*b* of the block 9 inwardly over the flange. The copper pin 11 is joined with part 23 of the housing by pressure. Part 23 may consist of copper, whereas parts 20 and 22 may be made of steel or an iron-nickel-cobalt alloy such as available in commerce under the trade names Kovar or Vacon. The part 21 serves for insulation and consists preferably of ceramic material. At those localities where the insulating ring-shaped part 21 is joined with the metal parts 20 and 22, the part 21 is preferably metallized so that it can be joined with the metal parts by soldering. A cable 24 is inserted from the outside into the connecting part 23 of the upper housing portion and is likewise joined therewith by a pressure connection.

Figure 3:
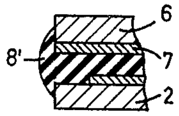
FIG. 3 shows in section a modified portion of a semiconductor member otherwise similar to that of FIG. 1.

The entire device possesses a very rugged and compact design capable of withstanding high alternating electric and thermal stresses. A change in forward direction of conductance of the entire device is obtained simply by reversing the semiconductor member consisting essentially of the semiconductor disc 4 and the carrier plates 2, 6. That is, when the semiconductor member is placed into the assembly with such an orientation that the carrier plate 6 faces the copper block 9, then the encapsuled device has a forward direction opposed to that of the one shown in FIG. 2. Such reversal in forward direction can be used to advantage, for example, in rectifier bridge networks in that all individual rectifier diodes appertaining to the same alternating-current phase can be fastened on one and the same heat-sink structure such as on a common bus of copper equipped with a coolant circulation. As shown in FIG. 1, it is of advantage to give the two carrier plates 2, 6 a considerably larger diameter than the semiconductor disc 4 so that a peripheral interspace or groove is formed between the two carrier plates and around the semiconductor disc. This groove is preferably filled with insulating material 8, such as casting resin as shown at 8. The insulating filler material can also be given such a shape that it protrudes beyond the peripheral edge of the carrier plates as is illustrated at 8' in FIG. 3. This has the advantage of increasing the creep-current distance between the two carrier plates which must be electrically insulated from each other in accordance with the potential difference occurring at the peak value of the blocking voltage. This potential may amount to about 1000 volts when operating with an alternating utility voltage of up to 220 volts for example.

I claim:

1. A semiconductor device, comprising a semiconductor member including an essentially monocrystalline plate of semiconductor material having spaced opposite substantially parallel surfaces, a contact electrode alloyed to each of the substantially parallel surfaces of said semiconductor plate, a first carrier plate alloy-bonded to one of said contact electrodes at one of the surfaces of said semiconductor plate and a second carrier plate alloy-bonded to the other of said contact electrodes at the opposite of the surfaces of said semiconductor plate, each of said first and second carrier plates being substantially of a metal having a thermal coefficient of expansion similar to that of said semiconductor material;

a housing including a cooling body of heat conducting material in heat conductive contact with one of said first and second carrier plates;

electrical conducting means in said housing in electrically conductive contact with the other of said first and second carrier plates; and holder means including pressure exerting means affixed to said cooling body in said housing and covering said semiconductor member for maintaining contact pressure between said semiconductor member and said cooling body.

2. A semiconductor device as claimed in claim 1, further comprising an aperture formed through said holder means, said electrical conducting means passing through the aperture formed through said holder means and comprising with said cooling body the sole current supply means for said semiconductor member.

3. A semiconductor device as claimed in claim 1, wherein said pressure exerting means comprises spring means positioned in said holder means in abutting contact with and between said holder means and one of said first and second carrier plates for maintaining contact pressure between said semiconductor member and said cooling body.

4. A semiconductor device as claimed in claim 1, further comprising an annular recess formed in the inside surface of said holder means to maintain a spaced relation between said holder means and said other of said first and second carrier plates.

5. A semiconductor device as claimed in claim 2, wherein said pressure exerting means comprising substantially annular spring means positioned around but spaced from said electrical conducting means in said holder means in abutting contact with and between said holder means and said other of said first and second carrier plates for maintaining contact pressure between said semiconductor member and said cooling body.

6. A semiconductor device as claimed in claim 3, wherein said contact pressure is 100 to 500 kg./cm$^2$.

7. A semiconductor device as claimed in claim 5, further comprising an annular recess formed in the inside surface of said holder means to maintain a spaced relation between said holder means and said other of said first and second carrier plates.

8. A semiconductor device as claimed in claim 1, wherein said first and second carrier plates are of the same size.

9. A semiconductor device as claimed in claim 1, wherein each of said first and second carrier plates is substantially of molybdenum and said cooling body comprises copper.

10. A semiconductor device as claimed in claim 1, wherein said semiconductor plate and each of said first and second carrier plates is of disc-like configuration and said semiconductor plate and said first and second carrier plates are coaxially positioned relative to each other.

11. A semiconductor device as claimed in claim 10, wherein each of said first and second carrier plates has a diameter larger than that of said semiconductor plate thereby providing an annular space around said semiconductor plate.

12. A semiconductor device as claimed in claim 11, further comprising electrical insulating material filling the annular space around said semiconductor plate between said first and second carrier plates.

(References on following page)

References Cited by the Examiner

UNITED STATES PATENTS

| | | | |
|---|---|---|---|
| 2,956,214 | 10/1960 | Herbst | 317—234 |
| 3,047,780 | 7/1962 | Metz | 317—234 |
| 3,059,157 | 10/1962 | English et al. | 317—234 |
| 3,125,709 | 3/1964 | Wagner | 317—234 |
| 3,155,885 | 11/1964 | Marino et al. | 317—234 |
| 3,188,536 | 6/1965 | Rittmann | 317—234 |

JOHN W. HUCKERT, *Primary Examiner.*

J. D. CRAIG, *Assistant Examiner.*